(12) United States Patent
Kataoka et al.

(10) Patent No.: US 7,523,548 B2
(45) Date of Patent: Apr. 28, 2009

(54) METHOD FOR PRODUCING A PRINTED CIRCUIT BOARD

(75) Inventors: Tatsuo Kataoka, Ageo (JP); Yoshikazu Akashi, Ageo (JP); Yutaka Iguchi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 19 days.

(21) Appl. No.: 10/580,948

(22) PCT Filed: Dec. 2, 2004

(86) PCT No.: PCT/JP2004/017943

§ 371 (c)(1),
(2), (4) Date: May 30, 2006

(87) PCT Pub. No.: WO2005/055681

PCT Pub. Date: Jun. 16, 2005

(65) Prior Publication Data

US 2007/0101571 A1    May 10, 2007

(30) Foreign Application Priority Data

Dec. 5, 2003 (JP) ............................. 2003-407539
Jul. 29, 2004 (JP) ............................. 2004-222183

(51) Int. Cl.
H05K 3/02 (2006.01)
B05D 5/12 (2006.01)
(52) U.S. Cl. ............................. 29/846; 29/47; 427/96.1
(58) Field of Classification Search .............. 29/846, 29/847; 427/96.1
See application file for complete search history.

(56) References Cited

U.S. PATENT DOCUMENTS

| | | | | |
|---|---|---|---|---|
| 4,687,545 A | * | 8/1987 | Williams et al. | ............ 216/107 |
| 5,369,881 A | * | 12/1994 | Inaba et al. | ................... 29/846 |
| 5,476,580 A | * | 12/1995 | Thorn et al. | ................ 205/122 |
| 5,550,006 A | * | 8/1996 | Larson et al. | ................ 430/311 |
| 5,998,739 A | | 12/1999 | Shirai | |
| 6,803,528 B1 | * | 10/2004 | Koyanagi | ..................... 174/262 |
| 6,875,519 B2 | | 4/2005 | Saeki et al. | |
| 2004/0101624 A1 | * | 5/2004 | Bayes | ......................... 427/337 |

FOREIGN PATENT DOCUMENTS

JP         5-315339 A       11/1993

(Continued)

*Primary Examiner*—C. J Arbes
(74) *Attorney, Agent, or Firm*—The Webb Law Firm

(57) ABSTRACT

A process for producing a printed wiring board comprises the steps of depositing a base metal on at least one surface of an insulating film to form a base metal layer and further depositing copper or a copper alloy to form a conductive metal layer, then removing a surface metal layer, which is formed through the above step, by etching to form a wiring pattern, and then treating the base metal layer with a treating liquid capable of dissolving and/or passivating the metal that forms the base metal layer. The printed wiring board so provided comprises an insulating film and a wiring pattern formed on at least one surface of the insulating film, the wiring pattern including a base metal layer deposited on the insulating film surface and a conductive metal layer, the base metal layer for forming the wiring pattern protrudes in a widthwise direction more than the conductive metal layer for forming the wiring pattern.

3 Claims, 6 Drawing Sheets

FOREIGN PATENT DOCUMENTS

| | | |
|---|---|---|
| JP | 06-120630 A | 4/1994 |
| JP | 7-161893 A | 6/1995 |
| JP | 8-186351 A | 7/1996 |
| JP | 2001-223461 A | 8/2001 |
| JP | 2001223471 A | 8/2001 |
| JP | 2003-037137 A | 2/2003 |
| JP | 2003-188495 A | 7/2003 |
| JP | 2003-282651 A | 10/2003 |
| JP | 2003282651 A * | 10/2003 |
| JP | 2003188495 A * | 7/2004 |
| JP | 2005-023340 A | 1/2005 |
| KR | 20030091769 A | 12/2003 |

* cited by examiner

METHOD FOR PRODUCING A PRINTED CIRCUIT BOARD

TECHNICAL FIELD

The present invention relates to a printed wiring board in which a wiring pattern is directly formed on a surface of an insulating film without interposing an adhesive layer, a process for producing the printed wiring board, and a circuit board mounted with an electronic part. More particularly, the present invention relates to a printed wiring board formed from a laminate of a two-layer structure consisting of an insulating film that becomes a substrate and a metal layer formed on a surface of the insulating substrate, a process for producing the printed wiring board, and a circuit device mounted with an electronic part.

BACKGROUND ART

Wiring boards have been heretofore produced by the use of copper-clad laminates in which a copper foil is laminated onto a surface of an insulating film such as a polyimide film using an adhesive.

Such a copper-clad laminate is produced by thermally bonding a copper foil under pressure to an insulating film having an adhesive layer formed on the surface. In the production of the copper-clad laminate, therefore, the copper foil must be handled alone. However, the tensile strength of the copper foil is lowered as the thickness thereof is decreased, and the lower limit of the thickness of the copper foil which can be handled alone is about 9 to 12 μm. If a copper foil having a thickness smaller than this thickness is used, handling of the copper film becomes very troublesome, for example, a copper foil with a support needs to be used. Further, if a wiring pattern is formed using a copper-clad laminate in which such a thin copper foil is bonded to a surface of an insulating film with an adhesive, warpage deformation of the resulting printed wiring board is brought about by heat shrinkage of the adhesive that is used for bonding the copper foil. In particular, with miniaturization and lightening of electronic equipments, thinning and lightening of printed wiring boards have been also promoted, and it is becoming impossible that the copper-clad laminates of three-layer structure consisting of an insulating film, an adhesive and a copper foil meet such printed wiring boards.

Then, instead of the copper-clad laminates of three-layer structure, laminates of two-layer structure in which a metal layer is directly laminated onto a surface of an insulating film have been employed. Such a laminate of a two-layer structure is produced by depositing a seed layer metal on a surface of an insulating film, such as a polyimide film, by means of electroless plating, deposition, sputtering or the like. On a surface of the metal thus deposited, copper or the like is deposited by plating, then a photoresist is applied, exposed to light and developed, and then etching is carried out, whereby a desired wiring pattern can be formed. In particular, the laminate of a two-layer structure is suitable for producing an extremely fine wiring pattern having a wiring pattern pitch width of less than 30 μm because the metal layer (e.g., copper layer) is thin.

By way of further background, Japanese Patent Laid-Open Publication No. 188495/2003 (JP '495) discloses a process for producing a printed wiring board comprising subjecting a metal coated polyimide film, which has a first metal layer formed on a polyimide film by a dry film-forming method and a second metal layer having conductivity that is formed by plating on the first metal layer, to etching to form a pattern, wherein after the etching, the etched surface is subjected to cleaning treatment with an oxidizing agent. In Example 5 of JP '495, an example comprising plasma depositing a nickel-chromium alloy in a thickness of 10 nm and then depositing copper in a thickness of 8 μm by plating is shown.

JP '495 further discloses that after the pattern is formed by etching, the first metal layer present on the surface of the polyimide resin film is treated with an oxidizing agent. In such a treatment using an oxidizing agent, however, a considerable amount of the first metal remains, and passivation thereof is not carried out completely, so that in severe environments short-circuit or the like sometimes occurs in a relatively short period of time. Further, the metal that forms the first metal layer in JP '495 is all treated with an oxidizing agent, but a part of the metal is hardly oxidized, and in this case, there is a possibility that favorable insulation is not formed between wiring patterns. In the treatment adopted in JP '495, moreover, a trace amount of a metal remaining is hardly passivated. Therefore, after a voltage is continuously applied for, for example, 1000 hours or more, the value of insulation resistance between wiring patterns tends to become lower than that before the application of a voltage though the value of insulation resistance is favorable immediately after the production.

Paragraphs [0004] and [0005] of Japanese Patent Laid-Open Publication No. 282651/2003 (JP '651) disclose that a metal layer 1 made of an alloy of copper and a metal other than copper is provided on a surface of a flexible insulating film 2 in order to ensure adhesion strength between the flexible insulating film and a wiring pattern, then on a surface of the metal layer 1 a copper foil is arranged to form a composite, and from the composite a flexible wiring board is produced. JP '651 further describes that at the peripheral lower part of the lead of the wiring pattern formed by the use of such a composite, the metal layer 1 remains as an unremoved part as shown in FIG. 5 of JP '651, and further discloses that because of the unremoved part, abnormal deposition 6 of the plating metal takes place. Moreover, JP '651 further discloses that at the place of the abnormal deposition 6 of the plating metal, a crystal of tin grows and becomes a "whiskers", and because of the whisker, a short-circuit takes place in the wiring pattern. That is to say, if the metal layer 1 provided to ensure adhesion strength of the wiring pattern is left as it is and if a tin plating layer is formed on the surface of the metal layer 1, a whisker is generated from the thus formed tin plating layer. In JP '651, therefore, the metal layer 1 is completely removed as described in paragraph [0023] thereof.

However, it is extremely difficult to completely remove the metal layer 1 from the outer periphery of the wiring pattern. In the process described in JP '651, the metal layer 1 remains as it is at the lower part of the outer periphery of the wiring pattern though the amount is small, and generation of whiskers from the tin plating layer attributable to the residual metal layer 1 cannot be completely prevented.

SUMMARY OF THE INVENTION

It has been found that if wiring patterns are formed by the use of such a laminate of a two-layer structure as mentioned above, insulation between the wiring patterns is impaired in a relatively short period of time.

As a result of studies of such a phenomenon, it has been found that since the wiring pattern formed by the use of the laminate of a two-layer structure is constituted of a first metal layer (seed layer) arranged directly on a surface of an insulating film and a copper layer formed on the first metal layer, migration caused by the copper layer and the first metal layer present below the copper layer is liable to occur, resulting in a problem that short-circuit attributable to migration takes place between the neighboring wiring patterns in a short period of time.

It is an object of the present invention to provide a process for producing a printed wiring board which rarely suffers occurrence of short-circuit attributable to migration and is capable of maintaining electrical stability for a long period of time.

It is another object of the present invention to provide a printed wiring board which is produced by the above process, has a specific structure and rarely suffers occurrence of short-circuit attributable to migration or the like.

The process for producing a printed wiring board of the present invention is a process comprising a step of depositing a base metal on a surface of an insulating film to form a base metal layer and depositing a conductive metal such as copper on a surface of the base metal layer and a step of selectively removing a surface metal layer (laminate of the base metal layer and the conductive metal layer), which is formed through the above step, by etching to form a wiring pattern, wherein:

after the surface metal layer is selectively removed by etching to form a wiring pattern, the base metal layer is treated with a treating liquid capable of dissolving and/or passivating the metal that forms the base metal layer.

That is to say, the process for producing a printed wiring board of the present invention is a process comprising a step of depositing a base metal on at least one surface of an insulating film to form a base metal layer and depositing copper or a copper alloy on a surface of the base metal layer to form a conductive metal layer and a step of selectively removing a metal layer of a base film, which is formed through the above step, by etching to form a wiring pattern, wherein:

after the metal layer of the base film is selectively removed by etching to form a wiring pattern, the base metal layer is treated with a treating liquid capable of dissolving and/or passivating the metal that forms the base metal layer.

The printed wiring board of the present invention obtained by, for example, the above process is a printed wiring board comprising an insulating film and a wiring pattern formed on a surface of the insulating film, said wiring pattern comprising a deposited base metal layer and a conductive metal layer such as a copper layer deposited on a surface of the base metal layer, the upper end of said base metal layer in a widthwise section of the wiring pattern being protruded widthwise from the lower end of the conductive metal layer that is deposited on the surface of the base metal layer.

That is to say, the printed wiring board of the present invention is a printed wiring board comprising an insulating film and a wiring pattern formed on at least one surface of the insulating film, said wiring pattern comprising a base metal layer formed on the insulating film surface and a conductive metal layer formed on a surface of the base metal layer, said base metal layer for forming the wiring pattern being protruded widthwise more than the conductive metal layer for forming the wiring pattern.

In the printed wiring board of the invention, it is preferable that the conductive metal layer has almost the same shape as that of a masking pattern and the wiring pattern and the insulating film are bonded by the base metal layer which is formed below the lower end of the wiring pattern composed of the conductive metal layer and around the wiring pattern and which is protruded widthwise from the conductive metal layer.

In the case where the base metal remains on the insulating film surface side where the wiring pattern is formed, the exposed surface of the base metal is preferably passivated. By virtue of passivation of the base metal layer present around the wiring pattern, whiskers are not generated from a plating layer formed on the surface of the base metal layer.

The circuit device of the present invention comprises the above-mentioned printed wiring board and an electronic part mounted thereon.

The present invention comprises a step, in which a base metal layer (seed layer or first metal layer) is formed on a surface of an insulating film by sputtering or the like, then a conductive metal such as copper is deposited on a surface of the base metal layer by for example plating, a photoresist is applied to the conductive metal surface and exposed and developed, then using the cured photoresist as a masking material, the copper layer is selectively etched to form a desired wiring pattern, and the base metal layer formed on the insulating film surface is treated with an etching solution capable of dissolving and/or passivating the metal that forms the base metal layer, whereby most of the base metal layer-forming metal present between lines can be removed; and a step, in which the surface of the base metal layer-forming metal remaining in a trace amount between lines and the surface of the base metal layer that is protruded around the conductive metal layer and along the outline of the conductive metal layer are oxidized and thereby passivated so that these base metal surfaces having been coated with an oxide film should not to be ionized in a high-temperature high-humidity atmosphere or even in a solution such as an acid. By virtue of such treatments, a printed wiring board very rarely-suffering occurrence of migration, having high insulation resistance and having extremely high reliability can be obtained.

DETAILED DESCRIPTION OF THE INVENTION

The printed wiring board of the invention is described in detail hereinafter in accordance with the production process.

Figure 1:
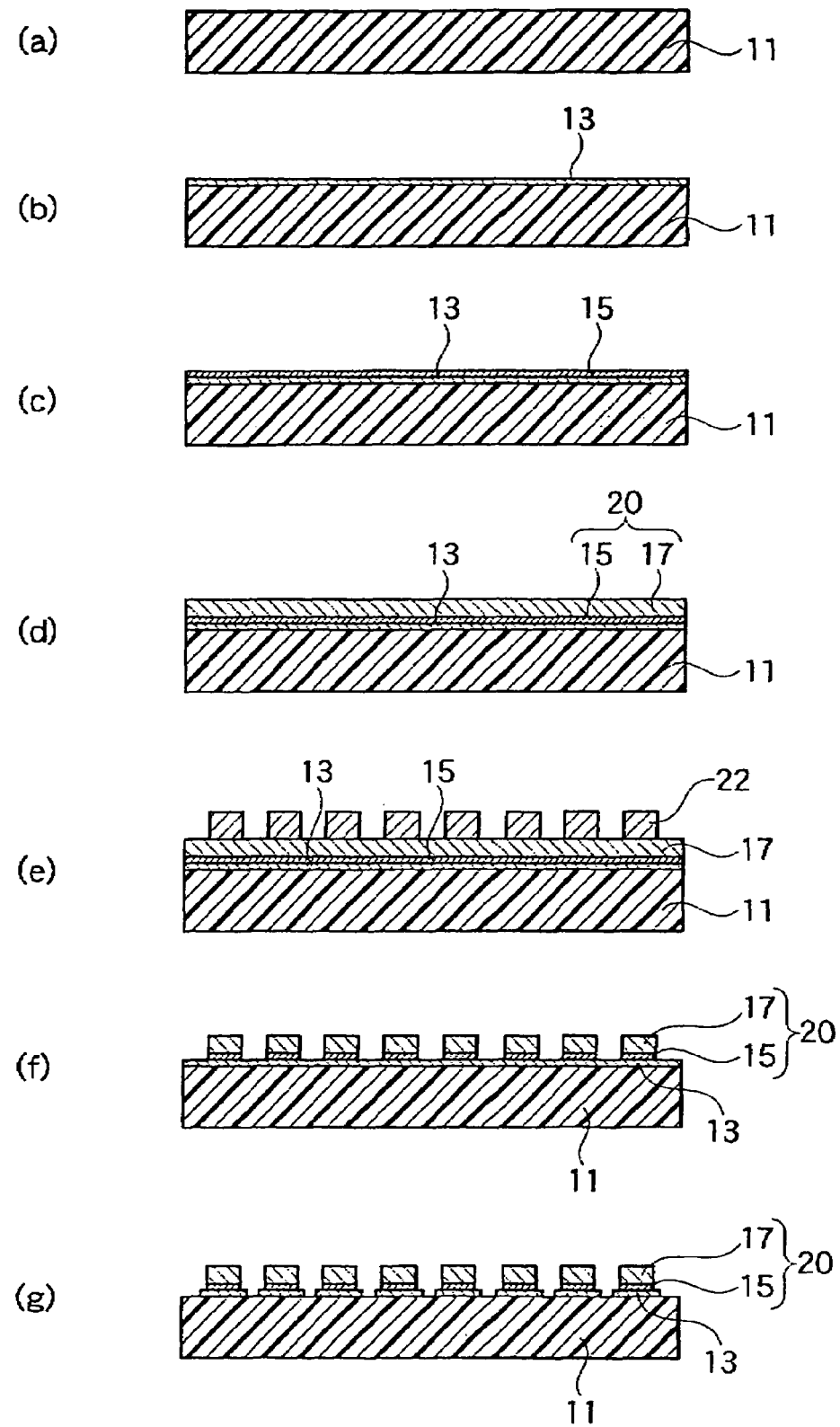
FIGS. 1(a)-(g) are a group of views showing sections of boards in a process for producing a printed wiring board of the present invention.
Figure 2:
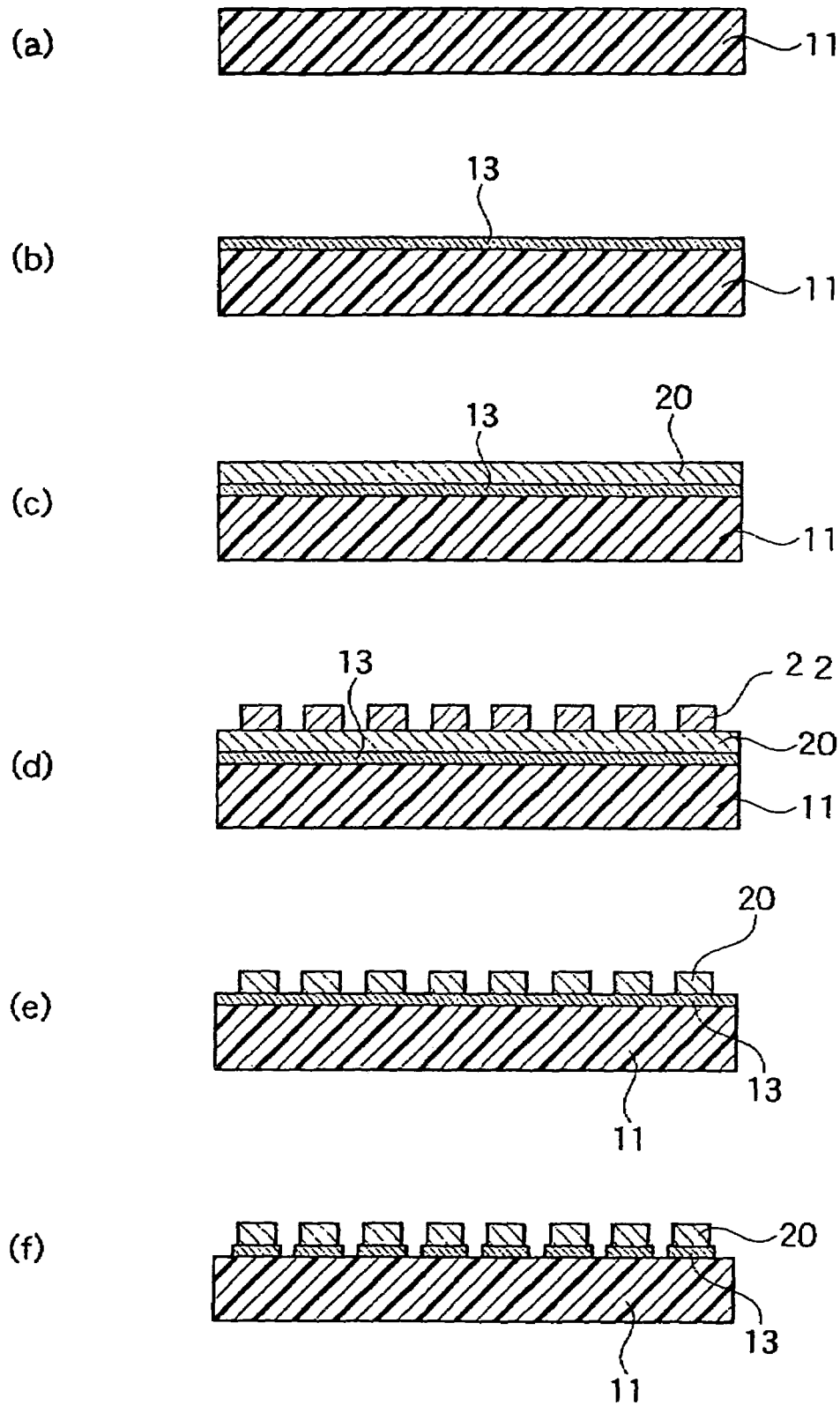
FIGS. 2(a)-(f) are a group of views showing sections of boards in a process for producing a printed wiring board of the present invention.

FIG. 1 and FIG. 2 are each a group of views showing sections of boards in a process for producing a printed wiring board of the invention.

As shown in FIG. 1 and FIG. 2, in the process for producing a printed wiring board of the invention, a film in which a metal layer consisting of a base metal layer 13 and a conductive metal layer 20 is formed on at least one surface of an insulating film is used as a base film, and the metal layer formed on the insulating film surface is selectively etched to form a wiring pattern. This metal layer may be formed on one surface of the insulating film or may be formed on both surfaces of the insulating film.

The process for producing a printed wiring board of the invention is described below with reference to an embodiment wherein a metal layer is formed on one surface of an insulating film. In the process for producing a printed wiring board of the invention, a base metal is deposited on at least one surface of an insulating film to form a base metal layer 13, as shown in FIG. 1(a) and FIG. 2(a). Examples of the insulating films 11 for use in the invention include a polyimide film, a polyimidoamide film, polyester, polyphenylene sulfide, polyether imide and a liquid crystal polymer. That is to say, these insulating films 11 are not deformed by heat given when a base metal layer 13 is formed, have acid resistance and alkali resistance of such a degree that they are not corroded by an etching solution used for etching or an alkali solution used for cleaning and have heat resistance of such a degree that they are not deformed by heating when a base metal layer 13 or the like is formed. As the insulating film 11 having such properties, a polyimide film is preferable.

The insulating film 11 has an average thickness of usually 7 to 150 µm, preferably 7 to 50 µm, particularly preferably 15 to 40 µm. The printed wiring board of the invention and the production process thereof are suitable for forming a thin board, so that it is preferable to use a thinner polyimide film. The surface of the insulating film 11 may have been subjected to surface roughening treatment using a hydrazine-KOH solution or plasma treatment in order to enhance adhesion to a base metal layer 13 described below.

On a surface of the insulating film, a base metal layer 13 is formed, as shown in FIG. 1(b) and FIG. 2(b). The base metal layer 13 is formed on at least one surface of the insulating film 11 and enhances adhesion between the insulating film 11 and a conductive metal layer 20 to be formed on a surface of the base metal layer 13.

Examples of the metals for forming the base metal layer 13 include copper, nickel, chromium, molybdenum, tungsten, silicon, palladium, titanium, vanadium, iron, cobalt, manganese, aluminum, zinc, tin and tantalum. These metals can be used singly or in combination. Of these metals, nickel, chromium or an alloy thereof is preferably used to form the base metal layer 13. It is preferable to form the base metal layer 13 on a surface of the insulating film 11 by a dry film-forming method such as deposition or sputtering. The thickness of the base metal layer is in the range of usually 1 to 100 nm, preferably 2 to 50 nm. This base metal layer 13 is provided for the purpose of stably forming a conductive metal layer 20 and is preferably formed by causing a part of the base metal, which has kinetic energy of such a degree that it physically thrusts into the insulating film surface, to collide with the insulating film.

In the present invention, therefore, the base metal layer 13 is particularly preferably a sputtering layer of the above-mentioned base metal.

After the base metal layer 13 is formed as above, a conductive metal layer 20 such as a copper layer is formed directly on a surface of the base metal layer 13, as shown in FIG. 1(c). The conductive metal layer can be formed by a plating method, such as electroplating or electroless plating.

In the present invention, after formation of the base metal layer 13 and before formation of the conductive metal layer 20 on the surface of the base metal layer 13, a sputtering copper layer 15 can be formed in the same manner as in the formation of the base metal layer 13 using the same metal as that of the conductive metal layer (e.g., copper layer) to be directly formed on the surface of the base metal layer 13, as shown in FIG. 1(c). For example, in the case where the base metal layer 13 is formed by sputtering using nickel and chromium, a copper layer 15 is formed by sputtering as a part of a conductive metal layer 20 to be formed on the surface of the base metal layer 13, and on the thus formed sputtering copper layer 15, a layer 17, the other part of the conductive metal layer 20 is further formed. The thickness of the sputtering copper layer 15 is in the range of usually 10 to 2000 nm, preferably 20 to 500 nm. The ratio between the average thickness of the base metal layer 13 and the thickness of the sputtering copper layer 15 is in the range of usually 1:20 to 1:100, preferably 1:25 to 1:60.

After the sputtering copper layer 15 is formed as above, the other conductive metal layer is formed on the surface of the sputtering copper layer 15 to complete a conductive metal layer 20. The other conductive metal layer (e.g., copper layer or copper alloy layer) further deposited herein is designated by numeral 17 in FIG. 1(d).

The conductive metal layer designated by numeral 17 can be formed by sputtering, deposition or the like, but it is preferable to form the layer by plating such as electroplating or electroless plating. That is to say, this plating conductive metal layer 17 needs to have a thickness necessary for forming a wiring pattern, and by the use of plating such as electroplating or electroless plating, a conductive metal can be efficiently deposited. The average thickness of the plating conductive metal layer 17 thus formed is in the range of usually 0.5 to 40 µm, preferably 0.5 to 17.5 µm, more preferably 1.5 to 11.5 µm, and the total thickness of the aforesaid sputtering copper layer 15 and this plating conductive metal layer 17 is in the range of usually 1 to 40 µm, preferably 1 to 18 µm, more preferably 2 to 12 µm. In the case where the conductive metal layer formed by plating is a plating copper layer, it is very difficult to find out a boundary between the sputtering copper layer 15 and the plating conductive metal layer 17 from their sectional structures after the plating conductive metal layer 17 is formed. In the present invention, these layers are put together and described as a "conductive metal layer 20" in the case where they do not need to be particularly distinguished.

After the conductive metal layer 20 is formed as above, the surface of the conductive metal of the conductive metal layer 20 is coated with a photosensitive resin, and the photosensitive resin is exposed to light and developed to form a desired pattern 22 made of the photosensitive resin as shown FIG. 1(e) and FIG. 2(d). As the photosensitive resin, a photosensitive resin of such a type as is cured by irradiation with light may be employed, or a photosensitive resin of such a type as is softened by irradiation with light may be employed.

By the use of the pattern 22 formed from the photosensitive resin as a masking material, the conductive metal layer 22 is selectively etched to form a desired pattern, as shown in FIG. 1(f), FIG. 2(e), FIG. 3 and FIG. 4.

Figure 3:
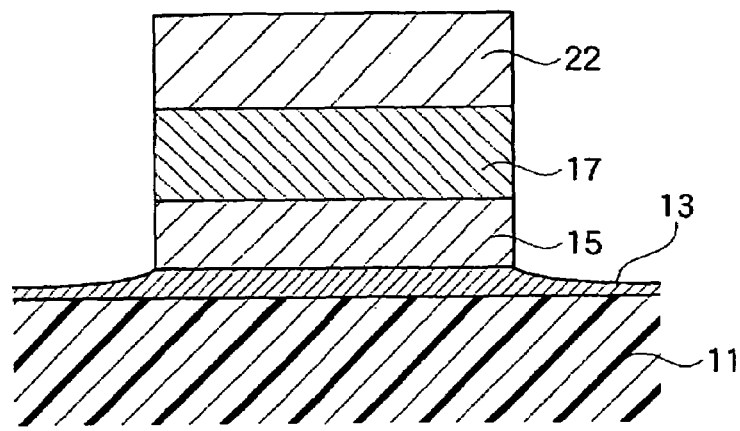
FIG. 3 is a view of a desired wiring pattern formed by selectively etching a copper layer.
Figure 4:
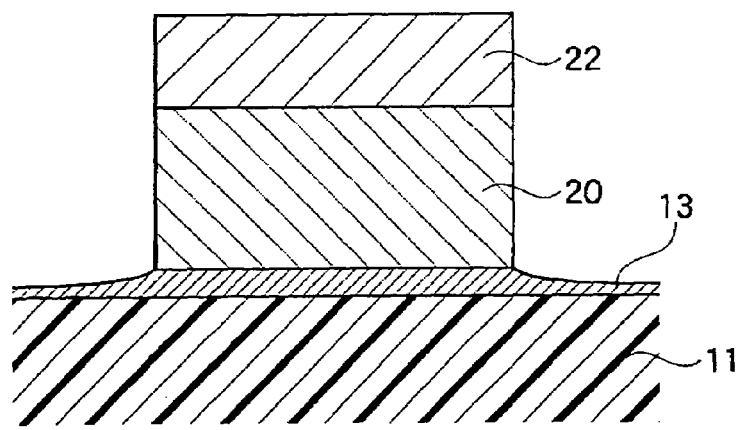
FIG. 4 is a view of a desired wiring pattern formed by selectively etching a copper layer.
Figure 5:
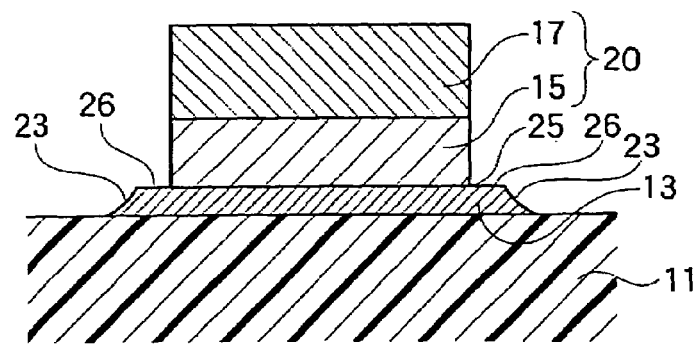
FIG. 5 is a sectional view of a wiring pattern formed by removing a base metal layer and then performing microetching.
Figure 6:
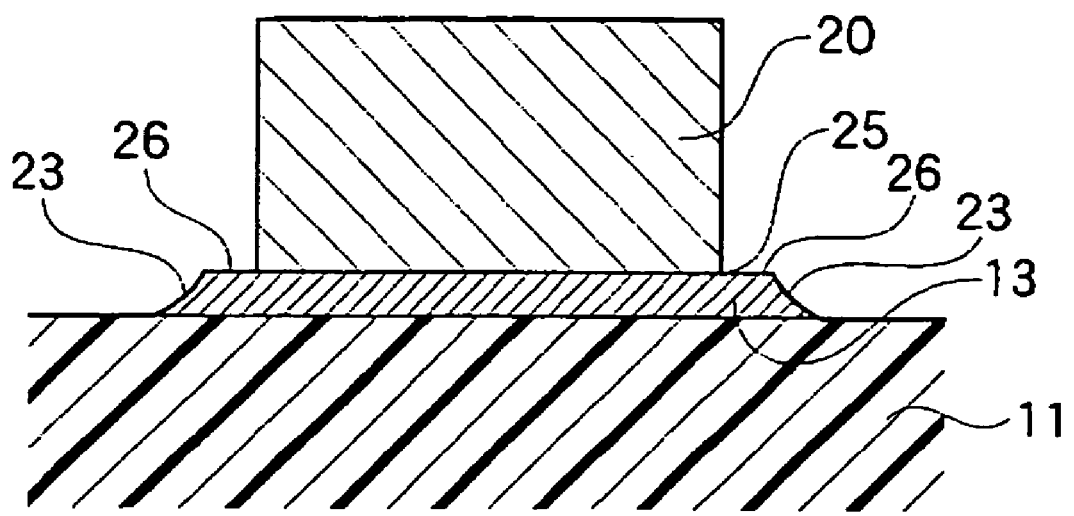
FIG. 6 is a sectional view of a wiring pattern formed by removing a base metal layer and then performing microetching.

The etching agent used herein is an agent for etching the conductive metal, particularly copper, and examples of such conductive metal etching agents include an etching solution containing ferric chloride as a major ingredient, an etching solution containing cupric chloride as a major ingredient, and an etching solution of sulfuric acid+hydrogen peroxide. The etching solution for the conductive metal can etch the conductive metal layer 20 with excellent selectivity to form a wiring pattern, and moreover, it has a considerable etching function for the base metal present between the conductive metal layer 20 and the insulating film 11. Therefore, when etching is carried out using the above-mentioned conductive metal etching agent, the base metal layer 13 can be etched to such an extent that the base metal layer remains as an extremely thin layer of about several nm on the surface of the insulating film 11, as shown in FIG. 1(f), FIG. 2(e), FIG. 3 and FIG. 4. That is to say, the thickness of the base metal layer at the periphery of the wiring pattern formed from a conductive metal is almost the same as that of the base metal layer present below the wiring patterns, as shown in FIG. 3 and FIG. 4.

The desired pattern 22 formed by curing the photosensitive resin in the formation of a wiring pattern is removed by, for example, alkali cleaning after the etching step and before microetching treatment in the subsequent step.

In the present invention, microetching (petty etching), namely, etching (e.g., pickling) of the surface of the conductive metal layer 20 that forms the wiring pattern and the base metal designated by numeral 13 to remove an oxide film from their surfaces, is preferably carried out before the base metal layer 13 is treated with a prescribed treating liquid in a manner described later.

For the microetching, an etching solution usually used is employable, and for example, a potassium persulfate ($K_2S_2O_8$) solution, a HCl solution or the aforesaid etching solution used for forming the wiring pattern is employable. If the contact time with the etching solution is long, copper that is a wiring pattern-forming conductive metal is dissolved in a large amount and the wiring pattern itself is thinned, so that the contact time of the wiring pattern with the etching solution in the microetching is in the range of usually 2 to 60 seconds, preferably about 10 to 45 seconds at the solution temperature of 20 to 60°.

In the present invention, after the conductive metal 20 is selectively etched as above, microetching is carried out, and then, the base metal layer 13 is treated with a treating liquid capable of dissolving and/or passivating the metal that forms the base metal layer 13, as shown in FIG. 1(g), FIG. 2(f), FIG. 5 and FIG. 6. The base metal layer 13 is formed by using copper, nickel, chromium, molybdenum, titanium, vanadium, iron, cobalt, aluminum, zinc, tin and tantalum singly or in combination. In the present invention, the base metal layer is treated with a treating liquid capable of dissolving and/or passivating these metals. For example, in the case where the base metal layer is formed by using nickel and chromium, a sulfuric acid/hydrochloric acid mixed solution having each concentration of about 5 to 15% by weight can be used for nickel, and an aqueous solution of potassium permanganate+KOH, an aqueous solution of potassium bichromate or an aqueous solution of sodium permanganate+KOH can be used for chromium. When the aqueous solution of potassium permanganate+KOH is used in the invention, the concentration of potassium permanganate is in the range of usually 10 to 60 g/liter, preferably 25 to 55 g/liter, and the concentration of KOH is in the range of usually 10 to 30 g/liter. In the present invention, the temperature for the treatment using such a liquid is in the range of usually 40 to 70° C., and the treating time is in the range of usually 10 to 60 seconds.

In the present invention, correspondingly to the metals contained in the base metal layer 13 formed, an etching solution capable of dissolving these metals is used as described above, and this etching solution has a function that it can passivate these metals if these metals remain in trace amounts.

Particularly in the invention, the base metal layer 13 is preferably an alloy layer formed from an alloy of at least two different metals, or a laminate obtained by independently laminating at least two different metals, or a laminate of alloys of different metals. In the case where the base metal layer 13 is formed by using, for example, nickel and chromium in the invention, the base metal layer 13 is preferably a layer formed from an alloy of nickel and chromium or a laminate consisting of a nickel layer and a chromium layer.

By the use of a treating liquid corresponding to the metal(s) for forming the base metal layer 13, the base metal layer 13 present on the insulating film 11 is removed or passivated, as shown in FIG. 1(g), FIG. 2(f), FIG. 5 and FIG. 6. Through this step, therefore, the wiring patterns formed become electrically independent from one another. By such a treatment, further, a side end 23 of the base metal layer 13 laminated on the insulating film is passivated, so that occurrence of migration from the side end 23 of the base metal layer 13 can be prevented.

In the treatment of the base metal layer 13 containing nickel and chromium, it is preferable that both of nickel and chromium are passivated and a chromium layer present between wiring patterns (between lines) is dissolved, and moreover, a trace amount of chromium which has not been dissolved and has remained is passivated.

Figure 7:
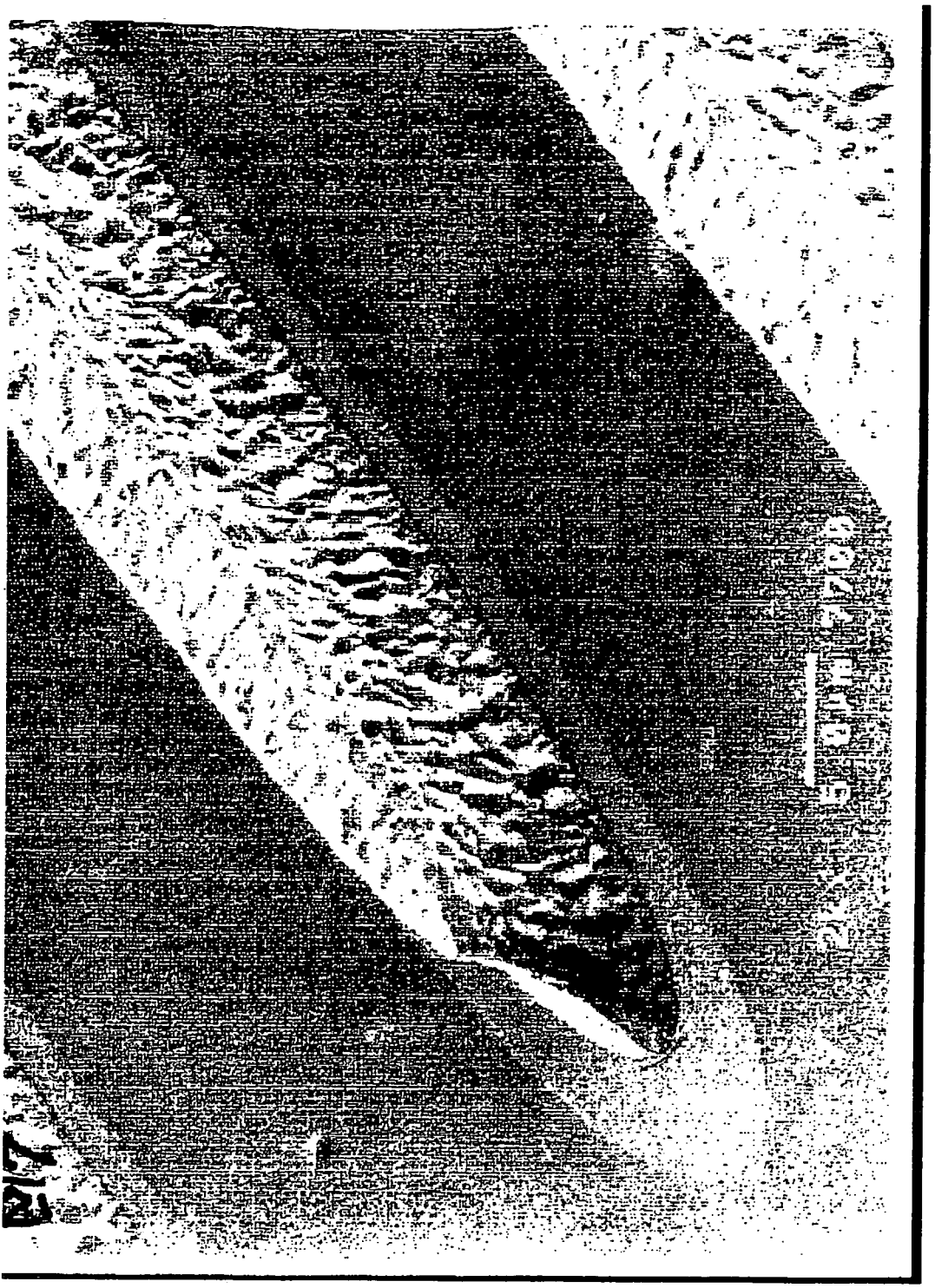
FIG. 7 is a SEM photograph of a wiring pattern formed in a printed wiring board of the present.
Figure 8:
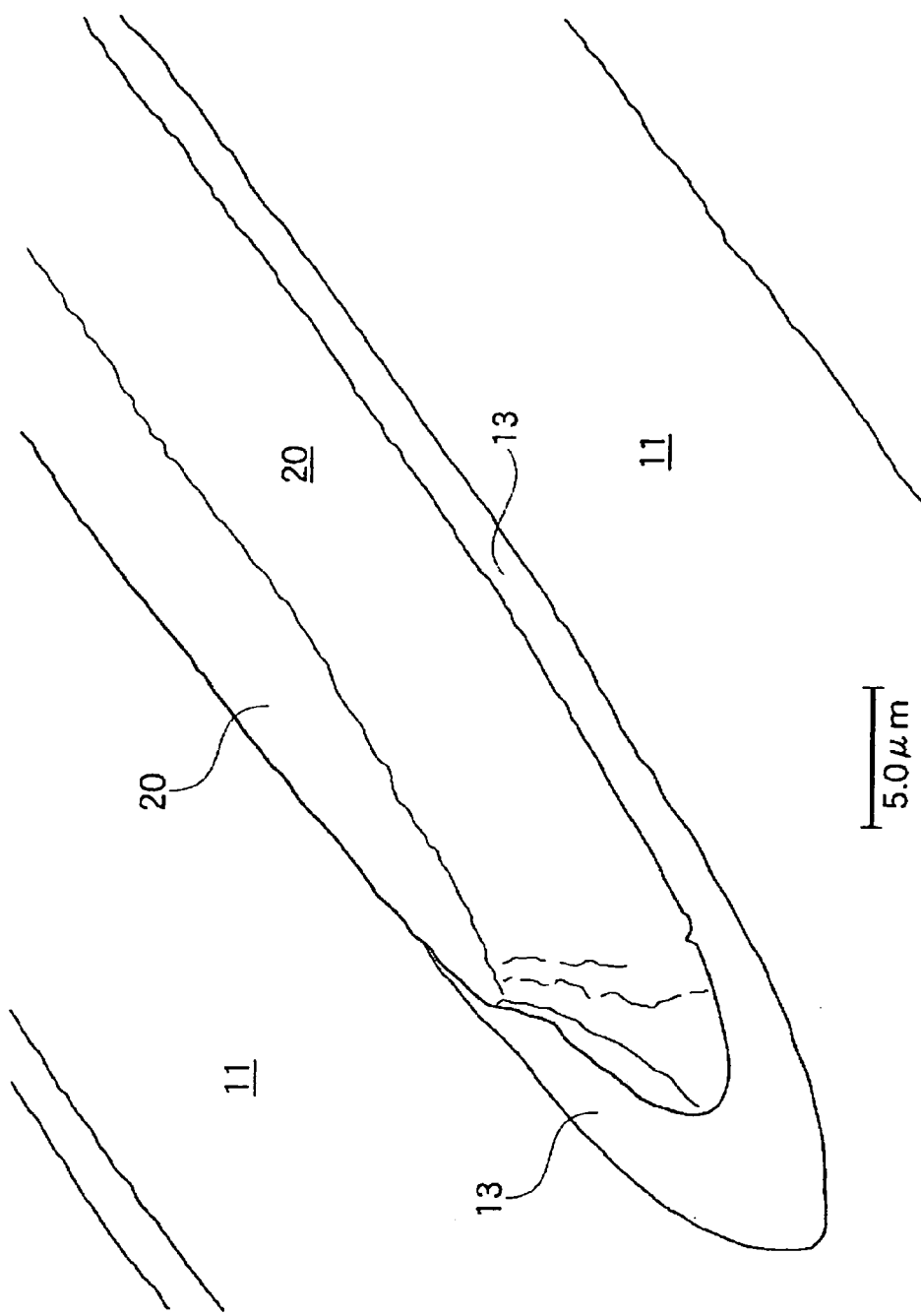
FIG. 8 is a perspective drawing of the SEM photograph of FIG. 7.

The wiring pattern of the printed wiring board obtained as above has such a structure that the upper end 26 of the base metal layer 13 in the widthwise section of the wiring pattern is formed around the pattern from the lower end 25 of the conductive metal layer 20 and along the outline of the conductive metal layer, as shown in FIG. 7 and FIG. 8. That is to say, the conductive metal layer 20 is etched, but the base metal layer 13 is hardly etched, so that in the widthwise section of the wiring pattern formed, the width of the upper end 26 of the base metal layer 13 becomes larger than the width of the lower end 25 of the wiring pattern made of the conductive metal layer 20. Thus, the upper end 26 of the base metal layer 13 is protruded widthwise more than the conductive metal layer 20. That is to say, as shown in FIG. 7 and FIG. 8, the wiring pattern consisting of the base metal layer 13 and the conductive metal layer 20 is formed on the surface of the insulating film 11, and the base metal layer 13 is formed around the conductive metal layer 20 constituting the wiring pattern with being protruded more than the conductive metal layer 20 along the outline of the conductive metal layer. As described above, the conductive metal layer has the same shape as that of the masking pattern, and the wiring pattern and the insulating film are bonded by the base metal layer which is formed below the lower end of the wiring pattern composed of the conductive metal layer and around the wiring pattern and which is protruded widthwise from the conductive metal layer. By forming the base metal layer around the lower end of the conductive metal layer so as to be widthwise protruded from the conductive metal layer as described above, the distance to reach the insulating film layer for the conductive metal ions (e.g., Cu ion) of the conductive metal layer is increased, and the boundary between the conductive metal layer and the base metal layer is surely sealed by the later-described tin plating layer, so that it is thought that diffusion of the conductive metal ions to the insulating film surface is inhibited.

By virtue of the base metal which is protruded widthwise from the conductive metal layer and is passivated, the base metal layer 13 formed along the outline of the conductive metal layer remains in a passive state. By allowing the base metal layer present around the wiring pattern to remain in a passive state, whiskers are not generated from a tin plating layer even if the tin plating layer is formed on the surface of the base metal layer thus possivated, and therefore, short-circuit attributable to growth of such whiskers does not take place in the printed wiring board of the invention.

In the printed wiring board of the invention having the above-mentioned sectional structure, the width 26 of the upper end of the base metal layer 13 is determined in the range of usually 1.001 to 1.5 times, preferably 1.01 to 1.25 times, the width 25 of the lower end of the conductive metal layer 20, whereby occurrence of migration can be effectively prevented.

The printed wiring board of the invention is produced as follows. Onto the base metal layer which is formed on the insulating film by sputtering or the like, the conductive metal layer (e.g., a copper layer formed by plating or a deposit of a sputtering copper layer and a plating copper layer provided thereon) which is made of a metal having different properties from the metal of the base metal layer is laminated; then the conductive metal layer thus laminated is selectively etched to form a wiring pattern composed of the conductive metal layer; then microetching is carried out to mainly treat the surface of the conductive metal layer; and the base metal layer is further treated with a treating liquid capable of dissolving and/or passivating the metal that forms the base metal layer, to dissolve and remove most of the metal that forms the base metal layer exposed between the wiring patterns and to passivate a trace amount of a residual metal (e.g., chromium) which has not been dissolved even by the treatment. Particularly in the production of the printed wiring board of the invention, the base metal layer is formed by sputtering plural metals, then the thus formed base metal layer is subjected to pickling treatment in order to etch the base metal layer, and then the base metal layer-forming metals which have not been removed by the pickling and have remained are passivated by the use of, for example, an oxidizing treating agent. Therefore, a printed wiring board having high insulation resistance, hardly suffering occurrence of short-circuit and having high reliability can be obtained.

Particularly in the printed wiring board of the invention, migration rarely occurs, and a substantial difference between the insulation resistance measured after continuous application of a voltage for a long period of time and the insulation resistance measured before application of a voltage is not observed, so that the printed wiring board has extremely high reliability.

The printed wiring board of the invention is suitable as a printed wiring board having a wiring pattern (or lead) width of not more than 30 µm, preferably 25 to 5 µm, and having a pitch width of not more than 50 µm, preferably 40 to 10 µm. Examples of such printed wiring boards include printed wiring board (PWB), TAB (tape automated bonding) tape, COF (chip on film) tape, CSP (chip size package) tape, BGA (ball grid array) tape, µ-BGA (µ-ball grid array) tape and FPC (flexible printed circuit) In the above description, the printed wiring board of the invention is a printed wiring board in which a wiring pattern is formed on a surface of an insulating film, but on a part of the wiring pattern, an electronic component may be mounted.

On the printed wiring board, a solder resist layer is preferably further formed, then the terminal part is subjected to plating treatment, and then an electronic component is mounted, whereby a circuit board is obtained.

The wiring pattern can be subjected to plating treatment, and examples of the plating treatments adopted herein include tin plating, gold plating, nickel-gold plating, solder plating and lead-free solder plating. In the plating treatment, it is possible that a thin plating layer is formed on the wiring pattern prior to application of a solder resist, then on the thin plating layer a solder resist layer is formed, and the connection terminal exposed from the solder resist layer is further subjected to plating treatment again. The thickness of the plating layer can be properly determined according to the type of the plating treatment, and in case of electroless tin plating, the whole thickness of the plating layer is in the range of usually 0.2 to 0.8 µm, preferably 0.3 to 0.6 µm.

EXAMPLES

The printed wiring board of the present invention and its production process are further described with reference to the following examples, but it should be construed that the invention is in no way limited to those examples.

All the insulation resistance values described in the following examples and comparative examples are values measured at room temperature outside a constant-temperature constant-humidity vessel.

Example 1

One surface of a polyimide film having an average thickness of 75 µm (available from Ube Industries, Ltd., Upirex S) was subjected to roughening treatment by back sputtering, and then a nickel-chromium alloy was sputtered under the following conditions to form a chromium-nickel alloy layer having an average thickness of 40 nm as a base metal layer.

That is to say, the polyimide film of 75 µm thickness was treated at 100° C. and $3 \times 10^{-5}$ Pa for 10 minutes to perform degassing, and then a chromium-nickel alloy was sputtered under the sputtering conditions of 100° C. and 0.5 Pa.

On the base metal layer formed as above, copper was further sputtered under the conditions of 100° C. and 0.5 Pa to form a sputtering copper layer having an average thickness of 300 nm.

On the surface of the sputtering copper layer formed as above, copper was deposited by electroplating to form an electrolytic copper layer (electroplating copper layer) having a thickness of 8 µm.

The surface of the copper layer (i.e., conductive metal layer) formed as above was coated with a photosensitive resin, and the photosensitive resin was exposed and developed to form a pattern of a comb-shaped electrode in such a manner that the wiring pitch should become 30 µm (line width: 15 µm, space width: 15 µm). Using this pattern as a masking material, the copper layer was etched for 30 seconds by the use of a cupric chloride etching solution containing 100 g/liter of HCl and having a concentration of 12% to form a wiring pattern.

After the pattern made of the exposed and developed photosensitive resin and used as a masking material was peeled off, the surface of the copper layer and the surface of the base metal layer (Ni—Cr alloy) were treated with a $K_2S_2O_8$+$H_2SO_4$ solution as a microetching solution at 30° C. for 10 seconds to perform pickling.

Subsequently, using an etching solution of potassium permanganate (concentration: 40 g/liter) and KOH (concentration: 20 g/liter), the Ni—Cr alloy protrusion part 26 was passivated at 40° C. for 1 minute, and further, a trace amount of chromium remaining between lines was dissolved as much as possible and the unremoved chromium was passivated as chromium oxide. Thereafter, washing with water was carried out.

Further, electroless Sn plating (plated thickness: 0.5 µm) was carried out, and then heating was carried out to form a prescribed pure Sn layer. To the printed wiring board having a comb-shaped electrode formed as above, a voltage of 40 V was applied under the conditions of 85° C. and 85% RH to perform a 1000-hr continuity test (HHBT). This continuity test is an accelerating test, and when the period of time taken before short-circuit takes place, for example, a period of time taken before the insulation resistance value becomes less than $1\times10^8\Omega$, is shorter than 1000 hours, the printed wiring board cannot be used as a general board. The insulation resistance of the printed wiring board of this example measured before the insulation reliability test was higher than those of comparative examples and was $5\times10^{14}\Omega$, while the insulation resistance thereof measured after the insulation reliability test was $2\times10^{14}\Omega$, so that a substantial difference in insulation resistance attributable to the application of a voltage was not observed between them.

The result is set forth in Table 1.

Example 2

One surface of a polyimide film having an average thickness of 75 μm (available from Ube Industries, Ltd., Upirex S) was subjected to roughening treatment by back sputtering, and then a nickel-chromium alloy was sputtered under the following conditions to form a chromium-nickel alloy layer having an average thickness of 40 nm as a base metal layer.

That is to say, the polyimide film of 75 μm thickness was treated at 100° C. and $3\times10^{-5}$ Pa for 10 minutes to perform degassing, and then a chromium-nickel alloy was sputtered under the sputtering conditions of 100° C. and 0.5 Pa.

On the surface of the sputtering base metal layer formed as above, copper was deposited by electroplating to form an electrolytic copper layer (electroplating copper layer) having a thickness of 8 μm.

The surface of the copper layer (i.e., conductive metal layer) formed as above was coated with a photosensitive resin, and the photosensitive resin was exposed and developed to form a pattern of a comb-shaped electrode in such a manner that the wiring pitch should become 30 μm (line width: 15 μm, space width: 15 μm). Using this pattern as a masking material, the copper layer was etched for 30 seconds by the use of a cupric chloride etching solution containing 100 g/liter of HCl and having a concentration of 12% to form a wiring pattern.

After the pattern made of the exposed and developed photosensitive resin and used as a masking material was peeled off, the surface of the copper layer and the surface of the base metal layer (Ni—Cr alloy) were treated with a $K_2S_2O_8$+$H_2SO_4$ solution as a microetching solution at 30° C. for 10 seconds to perform pickling.

Subsequently, using an etching solution of potassium permanganate (concentration: 40 g/liter) and KOH (concentration: 20 g/liter), the Ni—Cr alloy protrusion part 26 was passivated at 40° C. for 1 minute, and further, a trace amount of chromium remaining between lines was dissolved as much as possible and the unremoved chromium was passivated as chromium oxide.

An example of an electron microscope photograph of the wiring pattern formed as above is shown in FIG. 7. FIG. 8 is a view obtained by tracing the electron microscope photograph shown in FIG. 7. Referring to FIG. 8, a wiring pattern consisting of the base metal layer 13 and the conductive metal layer 20 is formed on a surface of an insulating film that is a polyimide film, and around the wiring pattern, the base metal layer 13 is protruded along the outline of the conductive metal layer, and the surface of the base metal layer 13 is passivated.

The wiring pattern formed as above was further subjected to electroless Sn plating (plated thickness: 0.5 μm) and then heated to form a prescribed pure Sn layer.

To the printed wiring board having a comb-shaped electrode formed as above, a voltage of 40 V was applied under the conditions of 85° C. and 85% RH to perform a 1000-hr continuity test (HHBT). The insulation resistance of the printed wiring board measured before the insulation reliability test was high and $5\times10^{14}\Omega$, while the insulation resistance thereof measured after the insulation reliability test was $2\times10^{14}\Omega$, so that a substantial difference in insulation resistance attributable to the application of a voltage was not observed between them.

The result is set forth in Table 1.

Example 3

One surface of a polyimide film having an average thickness of 38 μm (available from Ube Industries, Ltd., Upirex S) was subjected to roughening treatment by back sputtering, and then a nickel-chromium alloy was sputtered in the same manner as in Example 1 to form a chromium-nickel alloy layer having an average thickness of 30 nm as a base metal layer.

On the base metal layer formed as above, copper was sputtered in the same manner as in Example 1 to form a sputtering copper layer having an average thickness of 200 nm.

On the surface of the sputtering copper layer formed as above, copper was deposited by electroplating to form an electrolytic copper layer (conductive metal layer) having a thickness of 8 μm.

The surface of the electrolytic copper layer thus formed was coated with a photosensitive resin, and the photosensitive resin was exposed and developed to form a pattern of a comb-shaped electrode in such a manner that the wiring pitch should become 30 μm. Using this pattern as a masking material, the copper layer was etched for 30 seconds by the use of a cupric chloride etching solution containing 100 g/liter of HCl and having a concentration of 12% to form a wiring pattern.

Then, the surface of the copper layer and the surface of the base metal layer (Ni—Cr alloy) were treated with a HCl solution as a microetching solution at 40° C. for 15 seconds to perform pickling.

Subsequently, using an etching solution of potassium permanganate (concentration: 40 g/liter) and KOH (concentration: 20 g/liter), the Ni—Cr alloy protrusion part 26 was passivated at 40° C. for 1 minute, and further, a trace amount of chromium remaining between lines was dissolved as much as possible and the unremoved chromium was passivated as chromium oxide.

Further, electroless Sn plating (plated thickness: 0.5 μm) was carried out, and then heating was carried out to form a prescribed pure Sn layer.

To the printed wiring board having a comb-shaped electrode formed as above, a voltage of 40 V was applied under the conditions of 85° C. and 85% RH to perform a 1000-hr continuity test. The insulation resistance of the printed wiring board measured before the insulation reliability test was higher than those of comparative examples and was $7\times10^{14}\Omega$, while the insulation resistance thereof measured after the insulation reliability test was $9\times10^{13}\Omega$, so that a substantial difference in insulation resistance attributable to the application of a voltage was not observed between them.

The result is set forth in Table 1.

Example 4

One surface of a polyimide film having an average thickness of 38 μm (available from Ube Industries, Ltd., Upirex S) was subjected to roughening treatment by back sputtering, and then a nickel-chromium alloy was sputtered in the same manner as in Example 1 to form a chromium-nickel alloy layer having an average thickness of 30 nm as a base metal layer.

On the surface of the sputtering layer formed as above, copper was deposited by electroplating to form an electrolytic copper layer (conductive metal layer) having a thickness of 8 μm.

The surface of the electrolytic copper layer formed as above was coated with a photosensitive resin, and the photosensitive resin was exposed and developed to form a pattern of a comb-shaped electrode in such a manner that the wiring pitch should become 30 μm. Using this pattern as a masking material, the copper layer was etched for 30 seconds by the use of a cupric chloride etching solution containing 100 g/liter of HCl and having a concentration of 12% to form a wiring pattern.

Then, the copper and the base metal layer (Ni—Cr alloy) were treated with a HCl solution as a microetching solution at 40° C. for 15 seconds to perform pickling.

Subsequently, using an etching solution of potassium permanganate (concentration: 40 g/liter) and KOH (concentration: 20 g/liter), the Ni—Cr alloy protrusion part 26 was passivated at 40° C. for 1 minute, and further, a trace amount of chromium remaining between lines was dissolved as much as possible and the unremoved chromium was passivated as chromium oxide.

Further, electroless Sn plating (plated thickness: 0.5 μm) was carried out, and then heating was carried out to form a prescribed pure Sn layer.

To the printed wiring board having a comb-shaped electrode formed as above, a voltage of 40 V was applied under the conditions of 85° C. and 85% RH to perform a 1000-hr continuity test. The insulation resistance of the printed wiring board measured before the insulation reliability test was higher than those of comparative examples and was $7 \times 10^{14}\Omega$, while the insulation resistance thereof measured after the insulation reliability test was $7 \times 10^{13}\Omega$, so that a substantial difference in insulation resistance attributable to the application of a voltage was not observed between them.

The result is set forth in Table 1.

Comparative Example 1

One surface of a polyimide film having a thickness of 25 μm (available from DuPont-Toray Co., Ltd., trade name: Kapton 100EN) was treated for 60 seconds in a 30% hydrazine-KOH aqueous solution. Thereafter, the polyimide film was washed with pure water for 10 minutes and dried at room temperature. The polyimide film was then placed in a vacuum deposition device. After plasma treatment, a Ni—Cr alloy of 40 nm was deposited by sputtering, and then a copper coating of 8 μm was further formed by plating to obtain a metal coated polyimide substrate.

The resulting substrate was treated with a ferric chloride solution of 40° Be (Baume) to form a comb-shaped pattern having a pitch of 40 μm (line width: 20 μm, space width: 20 μm), then washed with an aqueous solution of potassium permanganate (0.5% by weight) and potassium hydroxide (0.5% by weight) at 35° C., further washed with water and dried. To the resulting sample, a bias of 40 V was applied in a constant-temperature constant-humidity vessel of an 85° C./85% RH atmosphere to perform an insulation reliability test (HHBT) The retention time was 1000 hours or more. Although the insulation resistance at the beginning of the insulation reliability test was $5 \times 10^{12}\Omega$, the insulation resistance measured after the lapse of 1000 hours was lowered to $2 \times 10^{10}\Omega$, so that lowering of insulation resistance with time attributable to the application of a voltage was observed.

Comparative Example 2

One surface of a polyimide film having an average thickness of 38 μm (available from Ube Industries, Ltd., Upirex S) was subjected to roughening treatment by back sputtering, and then a nickel-chromium alloy was sputtered in the same manner as in Example 1 to form a chromium-nickel alloy layer having an average thickness of 30 nm as a base metal layer.

On the base metal layer formed as above, copper was sputtered in the same manner as in Example 1 to form a sputtering copper layer having an average thickness of 200 nm.

On the surface of the sputtering copper layer formed as above, copper was deposited by electroplating to form an electrolytic copper layer having a thickness of 8 μm.

The surface of the electrolytic copper layer formed as above was coated with a photosensitive resin, and the photosensitive resin was exposed and developed to form a pattern of a comb-shaped electrode in such a manner that the wiring pitch should become 30 μm. Using this pattern as a masking material, the copper layer was etched for 30 seconds by the use of a cupric chloride etching solution containing 100 g/liter of HCl and having a concentration of 12% to form a wiring pattern.

Then, the copper pattern and the base metal layer protrusion part made of Ni—Cr were subjected to etching at 30° C. for 10 seconds using a $K_2S_2O_8+H_2SO_4$ solution as a microetching solution to perform pickling. Further, electroless Sn plating (plated thickness: 0.5 μm) was carried out, and then heating was carried out to form a prescribed pure Sn layer.

To the printed wiring board having a comb-shaped electrode formed as above, a voltage of 40 V was applied under the conditions of 85° C. and 85% RH to perform a 1000-hr continuity test (HHBT). As a result, the insulation resistance measured before the insulating reliability test was $2 \times 10^8\Omega$, but the insulation resistance measured after the lapse of 10 hours was lowered to $5 \times 10^6\Omega$ The result is set forth in Table 1

TABLE 1

| | Insulating film | Base metal layer | Sputtering layer | | Plating layer | |
| --- | --- | --- | --- | --- | --- | --- |
| | Polyimide | Nickel-chromium | Metal | Thickness | Metal | Thickness |
| Ex. 1 | 75 μm | 40 nm | copper | 300 nm | electrolytic copper | 8 μm |
| Ex. 2 | 75 μm | 40 nm | — | — | electrolytic copper | 8 μm |
| Ex. 3 | 38 μm | 40 nm | copper | 200 nm | electrolytic copper | 8 μm |

TABLE 1-continued

| | | | | | | |
|---|---|---|---|---|---|---|
| Ex. 4 | 38 μm | 30 nm | — | — | electrolytic copper | 8 μm |
| Comp. Ex. 1 | 25 μm | 40 nm | copper | 300 nm | electrolytic copper | 8 μm |
| Comp. Ex. 2 | 38 μm | 30 nm | copper | 200 nm | electrolytic copper | 8 μm |

| | Etching agent | | | HHBT Insulation |
|---|---|---|---|---|
| | Cu etching | Microetching | Nickel-chromium | resistance after 1000 hours |
| Ex. 1 | cupric chloride | $K_2S_2O_8 + H_2SO_4$ | $KMnO_4$ + KOH | $2 \times 10^{14}$ Ω |
| Ex. 2 | cupric chloride | $K_2S_2O_8 + H_2SO_4$ | $KMnO_4$ + KOH | $2 \times 10^{14}$ Ω |
| Ex. 3 | cupric chloride | HCl | $KMnO_4$ + KOH | $9 \times 10^{13}$ Ω |
| Ex. 4 | cupric chloride | HCl | $KMnO_4$ + KOH | $7 \times 10^{13}$ Ω |
| Comp. Ex. 1 | ferric chloride | none | $KMnO_4$ + KOH | $2 \times 10^{10}$ Ω |
| Comp. Ex. 2 | cupric chloride | $K_2S_2O_8 + H_2SO_4$ | none | After 10 hours $5 \times 10^6$ Ω |

In the process for producing a printed wiring board of the invention and the printed wiring board obtained by this process, the base metal layer formed on the surface of the insulating film is subjected to a treatment that is different from a treatment for the conductive metal layer formed on the base metal layer, so that migration hardly occurs from this place, and stable insulation is maintained between the formed wiring patterns for a long period of time.

Moreover, the insulation resistance between the wiring patterns is not changed even by continuously applying a voltage for a long period of time, and a printed wiring board that is electrically very stable in spite of the lapse of time is obtained.

The invention claimed is:

1. A process for producing a printed wiring board, comprising:

depositing a base of metal nickel and chromium on at least one surface of an insulating film to form a base metal layer and depositing a conductive metal layer of copper or a copper alloy on a surface of the base metal layer, thereby forming a surface metal layer;

selectively removing the surface metal layer by etching with an etching solution containing at least one selected from ferric chloride, cupric chloride, and a mixture of sulfuric acid and hydrogen peroxide to form a wiring pattern;

microetching the surface metal layer with a solution containing potassium persulfate; and treating the base metal layer with an etching solution containing at least one selected from a mixture of potassium permanganate and KOH, potassium bichromate, and a mixture of sodium permanganate and KOH.

2. The process for producing a printed wiring board as claimed in claim 1, wherein the conductive metal layer is obtained by depositing copper or a copper alloy by plating.

3. The process for producing a printed wiring board as claimed in claim 1, wherein after the metal layer of the base film is selectively removed by etching to form a wiring pattern, the surface of the wiring pattern formed by selectively etching the metal layer is subjected to pickling, and then the base metal layer is treated with a treating liquid capable of dissolving chromium and passivating an extremely slight amount of chromium which has not been dissolved.

* * * * *